United States Patent
Konrath et al.

(10) Patent No.: US 9,859,383 B2
(45) Date of Patent: Jan. 2, 2018

(54) SCHOTTKY DIODE WITH REDUCED FORWARD VOLTAGE

(71) Applicant: Infineon Technologies AG, Neubiberg (DE)

(72) Inventors: Jens Peter Konrath, Villach (AT); Roland Rupp, Lauf (DE); Hans-Joachim Schulze, Taufkirchen (DE)

(73) Assignee: Infineon Technologies AG, Neubiberg (DE)

( * ) Notice: Subject to any disclaimer, the term of this patent is extended or adjusted under 35 U.S.C. 154(b) by 124 days.

(21) Appl. No.: 14/548,709

(22) Filed: Nov. 20, 2014

(65) Prior Publication Data

US 2015/0144966 A1 May 28, 2015

(30) Foreign Application Priority Data

Nov. 26, 2013 (DE) .................. 10 2013 019 851

(51) Int. Cl.
  *H01L 29/36* (2006.01)
  *H01L 29/872* (2006.01)
  *H01L 29/16* (2006.01)
  *H01L 29/66* (2006.01)

(52) U.S. Cl.
  CPC .......... *H01L 29/36* (2013.01); *H01L 29/1608* (2013.01); *H01L 29/66143* (2013.01); *H01L 29/872* (2013.01)

(58) Field of Classification Search
  CPC .................. H01L 29/1608; H01L 29/872
  See application file for complete search history.

(56) References Cited

U.S. PATENT DOCUMENTS

| | | | | |
|---|---|---|---|---|
| 4,003,072 A | * | 1/1977 | Matsushita et al. | 257/170 |
| 4,134,123 A | * | 1/1979 | Shannon | 257/484 |
| 5,101,244 A | * | 3/1992 | Mori et al. | 257/471 |
| 6,084,264 A | * | 7/2000 | Darwish | H01L 29/0634 257/329 |
| 6,184,545 B1 | * | 2/2001 | Werner et al. | 257/109 |
| 8,963,276 B2 | * | 2/2015 | Watanabe et al. | 257/484 |
| 2002/0017647 A1 | * | 2/2002 | Bakowski et al. | 257/77 |
| 2007/0096239 A1 | * | 5/2007 | Cao et al. | 257/458 |
| 2011/0215338 A1 | * | 9/2011 | Zhang | 257/73 |
| 2013/0140584 A1 | | 6/2013 | Kameshiro et al. | |
| 2014/0266403 A1 | * | 9/2014 | Das et al. | 327/493 |

FOREIGN PATENT DOCUMENTS

JP 2003051601 A 2/2003
JP 2010225878 A 10/2010

* cited by examiner

*Primary Examiner* — Fernando L Toledo
*Assistant Examiner* — Neil Prasad
(74) *Attorney, Agent, or Firm* — Eschweller & Potashnik, LLC

(57) ABSTRACT

A semiconductor component includes a semiconductor body of a first conduction type and a metal layer on the semiconductor body, wherein the metal layer forms with the semiconductor body a Schottky contact along a contact surface. A doping concentration of the first conduction type on the contact surface varies along a direction of the contact surface.

17 Claims, 3 Drawing Sheets

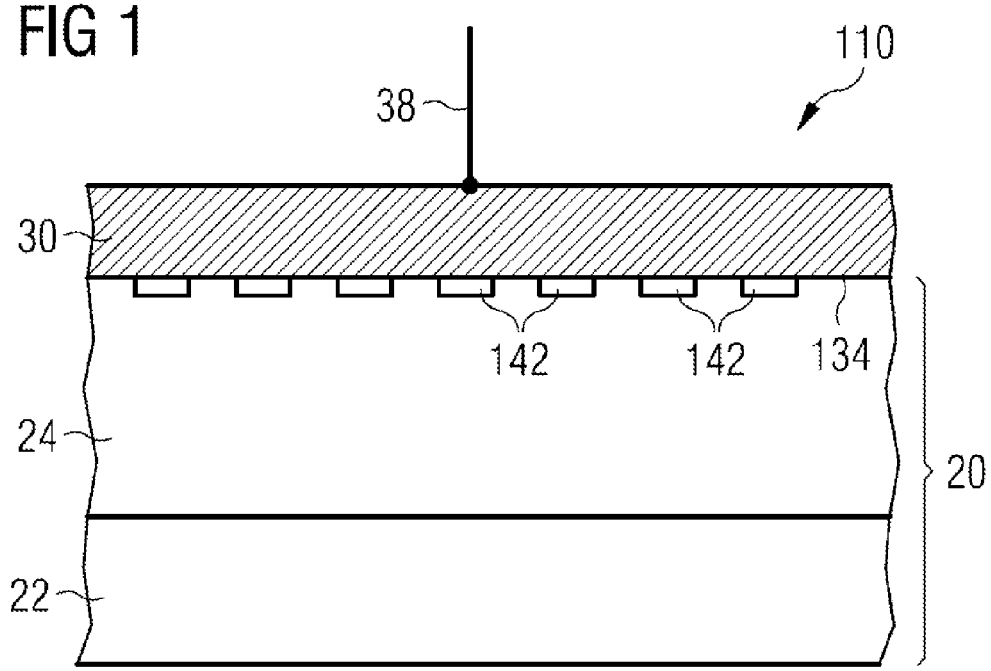
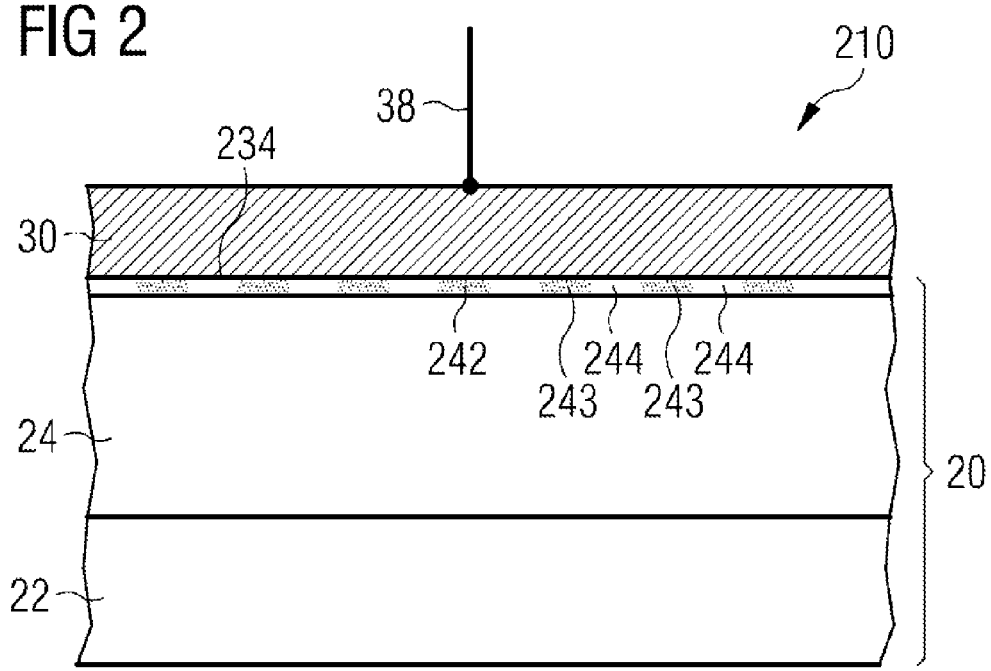

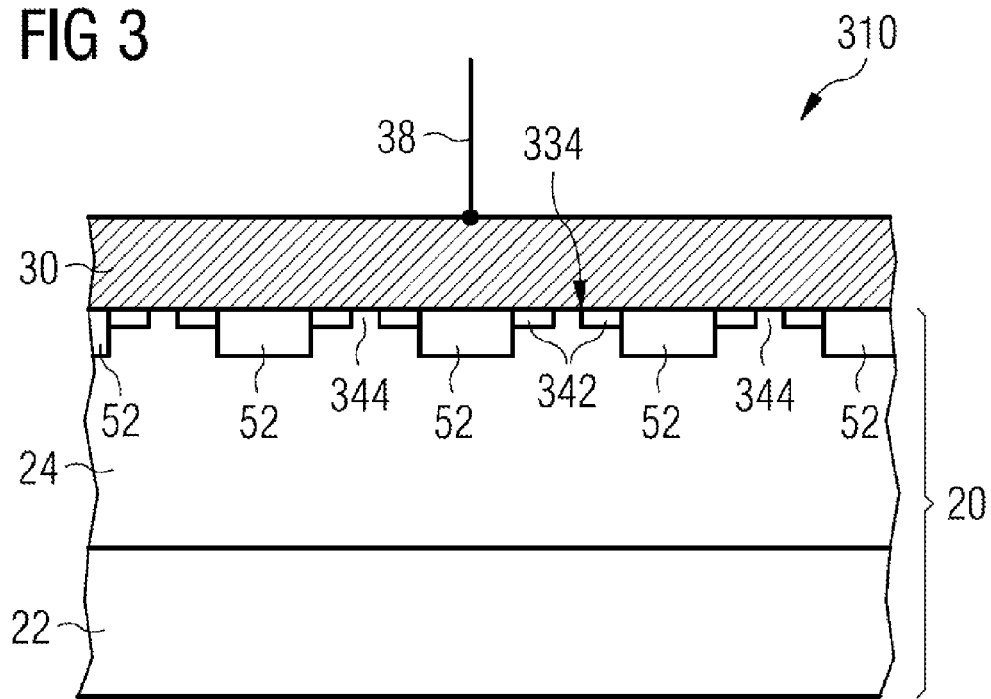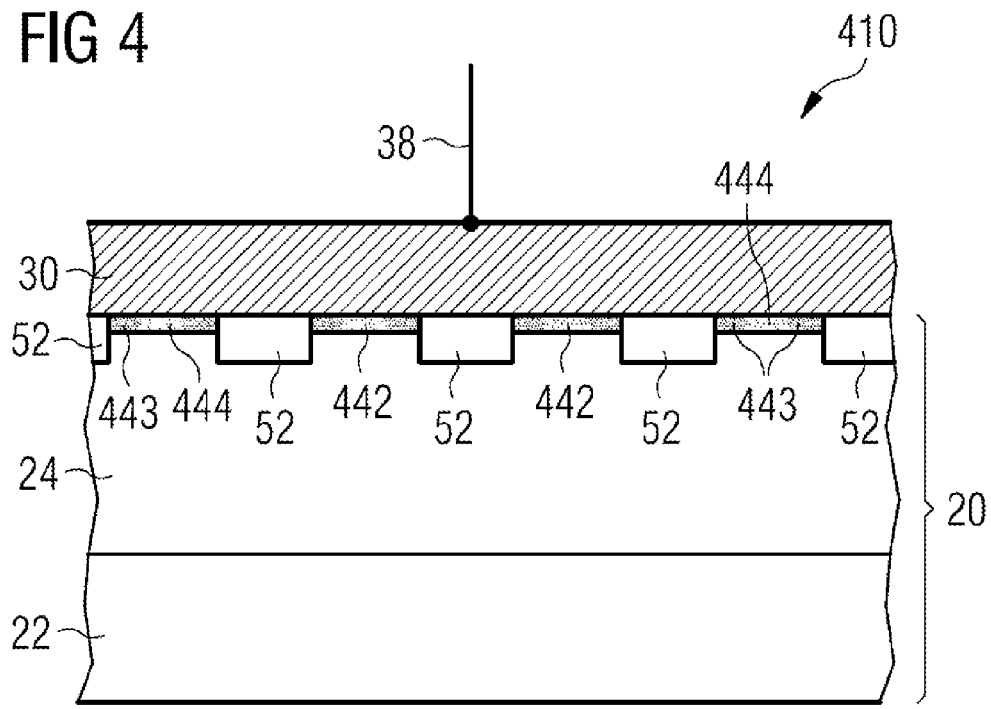

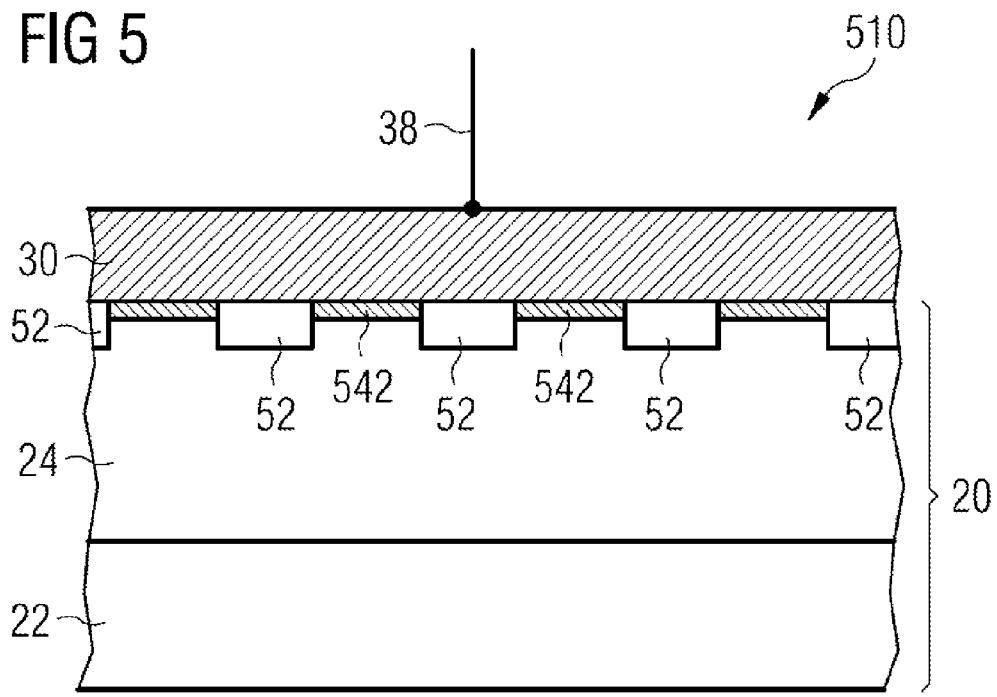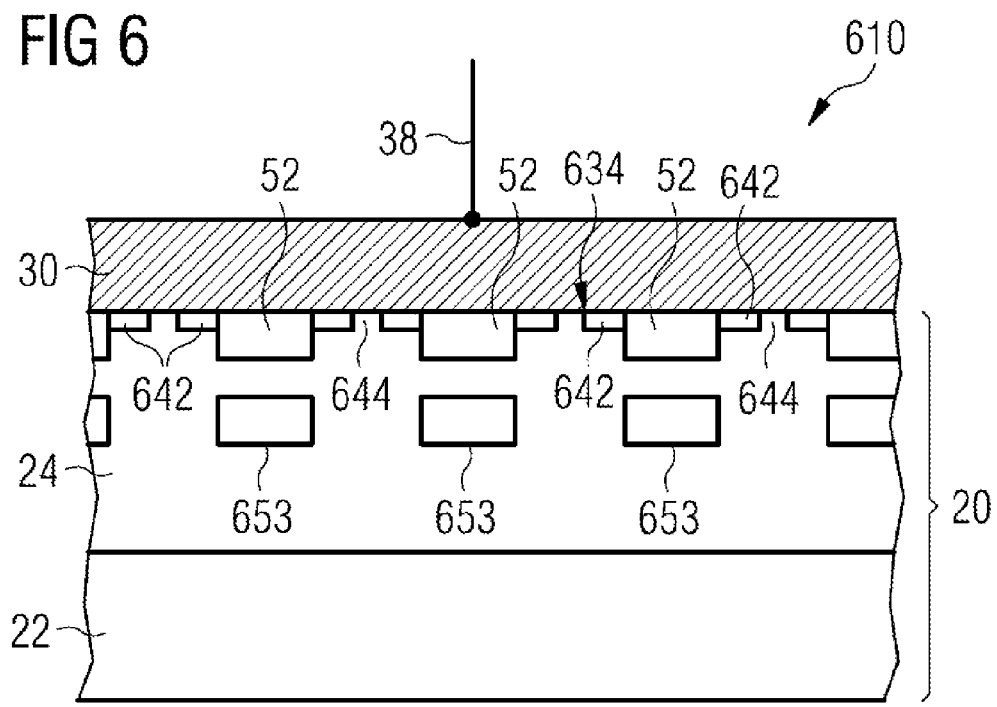

SCHOTTKY DIODE WITH REDUCED FORWARD VOLTAGE

REFERENCE TO RELATED APPLICATION

This application claims priority to German application number 10 2013 019 851.8, filed on Nov. 26, 2013.

FIELD

The present disclosure relates to semiconductor components and to methods for their production. In particular, current surge-proof Schottky diodes and methods for their production, for example from SiC, are described.

BACKGROUND

Besides their speed in comparison with pin diodes, Schottky diodes have a lower voltage drop in the forward direction. The voltage drop in the forward direction, also known as the forward voltage, is determined by the Schottky metal and by the semiconductor doping at the Schottky contact. Besides silicon, other semiconductor materials may also be used for Schottky diodes. Silicon carbide (SiC) Schottky diodes are often used, particularly for higher breakdown voltages.

However, modification of the forward voltage by changing the semiconductor doping, the semiconductor material or the Schottky metal also has an effect on the breakdown current.

SUMMARY

The disclosure relates to a semiconductor component.

In one example, the semiconductor component comprises a semiconductor body of a first conduction type and a metal layer on the semiconductor body, the metal layer with the semiconductor body forming a Schottky contact along a contact surface. A doping concentration of the first conduction type on the contact surface varies along a direction of the contact surface.

In another example, the semiconductor component comprises a semiconductor body of a first conduction type and a metal layer on the semiconductor body, the metal layer with the semiconductor body forming a Schottky contact along a contact surface. At least one region of the second conduction type and a region with increased doping concentration, in which the doping concentration of the first conduction type is greater than a doping concentration of the semiconductor body, are arranged on the contact surface.

BRIEF DESCRIPTION OF THE DRAWINGS

FIG. 1 shows, with the aid of a schematic cross-sectional view, a first example of a Schottky diode of the present description with laterally varying doping on the contact surface;

FIG. 2 shows, with the aid of a schematic cross-sectional view, a second example of a Schottky diode of the figure with laterally varying doping on the contact surface;

FIG. 3 shows, with the aid of a schematic cross-sectional view, a third example of the present disclosure with MPS islands;

FIG. 4 shows, with the aid of a schematic cross-sectional view, a fourth example of the present disclosure with MPS islands;

FIG. 5 shows, with the aid of a schematic cross-sectional view, a fifth example of the Schottky diode of the present disclosure; and FIG. 6 shows, with the aid of a schematic cross-sectional view, a sixth example of the Schottky diode with buried p-type regions.

DETAILED DESCRIPTION

Example embodiments of the disclosure will be explained in more detail below with reference to the appended figures. The disclosure is not however restricted to the embodiments specifically described, but may be modified and varied in a suitable way. It is within the scope of the disclosure to suitably combine individual features and feature combinations of one embodiment with features and feature combinations of another embodiment, in order to obtain other embodiments according to the disclosure.

Before the example embodiments of the present disclosure are explained in more detail below with the aid of the figures, it will be pointed out that elements which are the same in the figures are provided with identical or similar references, and that repeated description of these elements is omitted. The figures show only a part of a component, and the component may comprise further elements. Furthermore, the figures are not necessarily true to scale. The focus is rather on explanation of the basic principle.

The present disclosure relates to a reduction of the forward voltage of a Schottky diode without affecting the breakdown voltage, or with only a small effect thereon.

FIG. 1 shows an example embodiment of a cross section through a portion of a Schottky diode 110. Merely a part of the Schottky diode 110, which may be repeated multiply as represented or in modified form and which may be followed by edge regions (not shown), is represented.

The Schottky diode comprises a semiconductor body 20, which in the example represented comprises a substrate 22 and a doped epitaxial layer 24, which together form a drift zone of the Schottky diode. The semiconductor body 20 may be of silicon or another semiconductor material. Semiconductor materials with a larger band gap may also be used. Particularly for higher voltages, silicon carbide (SiC) may be used. The Schottky diode comprises an electrode 30, which is arranged on the epitaxial layer 24 and forms a contact surface 34 having a Schottky contact with the semiconductor body 20. The electrode 30 may be of a metal or of any other material which forms a Schottky contact with the epitaxial layer 24. The electrode 30 forms the anode of the Schottky diode 110 and is connected to an anode terminal 38.

The epitaxial layer 24 may comprise a doped semiconductor material, for example n-doped silicon, in particular n-doped SiC.

In the example of FIG. 1, the doping concentration of the n-doped drift zone is locally increased on the contact surface 134 of the Schottky contact. These more heavily doped regions 142 with an increased doping concentration compared with the drift zone 24 alternate with regions of weaker doping, or may be entirely interrupted so that the contact surface 134 has at least one region with doping that corresponds to the doping of the drift zone. In these examples, there is always a lateral variation of the n-type doping. The increased n-type doping is thus not surface-wide, but varies along the contact surface, i.e. in the lateral direction.

The doping of the drift zone may be constant doping. It is, however, also possible for the doping of the drift zone to vary in the vertical direction. In this case, the doping variation of the drift zone may be continued into the region of the contact surface 134.

By the lateral variation of the n-type doping, the local increase in the n-type doping in the more heavily doped regions 142 of the Schottky barrier may be increased in a locally restricted way. In this way, it is possible to modify, in particular reduce, the forward voltage of the diode, without modifying the material composition comprising semiconductor material of the drift zone and metal of the anode, and at the same time without significantly increasing the breakdown current.

The lateral variation in the n-type doping is represented as a discrete variation in steps in FIG. 1. These steps may be more or less discrete, and there may also be a continuous or gradual lateral variation or a stepwise variation of the doping concentration in two or more steps. It is likewise possible to envisage a combination of regions with constant n-type doping and transition regions with varying doping, or a continuously changing doping concentration on the contact surface 134. For example, the more heavily doped regions 142 may be achieved by structured flat implantation into the semiconductor, in the example represented into the epitaxial layer 24.

The flat implantation leads to vertical extents or thickness of the more heavily doped regions 142, for example of less than 100 nm, when SiC is used as the semiconductor material. With an implantation energy of 50 keV for nitrogen, more heavily doped regions 142 with a thickness of approximately 10 nm or less may be achieved in SiC. If silicon is used as the semiconductor material, a vertical thickness in the range of up to 1 μm may be advantageous for the more heavily doped regions.

FIG. 2 shows a variant of the Schottky diode represented in FIG. 1. The Schottky diode 210 of FIG. 2 corresponds to the Schottky diode 110 of FIG. 1, with the difference that over the entire contact surface 234 a continuously more heavily doped layer 242 is arranged between the electrode 30 and the semiconductor body 20. The doping of the more heavily doped layer 242 is varied along at least one direction of the contact surface 234, and contains regions 243 with heavy doping and regions 244 with weaker doping, which may alternate with one another. The more heavily doped layer 242 may likewise be produced by means of flat structured implantation.

FIG. 3 shows another example of a Schottky diode 310 of the present disclosure. The Schottky diode 310 of FIG. 3 corresponds to the example of FIG. 1, although in this case a multiplicity of p-doped regions 52 are additionally arranged in the epitaxial layer 24 on the contact surface 334. These p-doped regions 52 are also known as MPS islands and are used to shield the Schottky contact against strong electric fields in breakdown operation of the Schottky diode. The term MPS is also known as Merged PiN Schottky, and in these components the Schottky junction is surrounded by pn junctions arranged in parallel, which are produced by the MPS islands. More heavily doped regions 342 are arranged on the contact surface 334 next to the p-doped regions 52. The more heavily doped regions 342 may fully or partially enclose the p-doped regions 52. The more heavily doped regions 342 have gaps 344, in which the doping concentration is not increased and corresponds to the drift zone, or the epitaxial layer 24. This leads to a variation in the doping concentration in the lateral direction. The more heavily doped regions 342 are likewise flat in the vertical direction and have a smaller depth of the contact surface 334 than the p-doped regions 52.

The more heavily doped regions 342 may correspond to the more heavily doped regions 42 of FIG. 1, and may likewise be produced by flat implantation. P-type doping is also carried out in this case, in which case the p-doped regions 52 may be arranged in the more heavily doped regions or between two more heavily doped regions.

FIG. 4 shows another example of a Schottky diode 410. The Schottky diode corresponds essentially to the Schottky diode 310 of FIG. 3, although in this case there is a more heavily doped layer 442 that entirely fills the intermediate spaces between neighboring p-doped regions 52. The more heavily doped layer therefore has regions 443 with heavy doping and regions 444 with weaker doping, the doping in the more heavily doped layer 442 varying continuously. In the example represented, the regions 443 with heavy doping are arranged next to the p-doped regions 52, and the n-type doping of the more heavily doped layer 442 decreases with an increasing distance from the p-doped regions 52. In this case, a variation of the doping concentration in the lateral direction is likewise achieved. Here again, the lateral variation of the doping concentration may take place stepwise.

FIG. 5 shows another example of a Schottky diode 510. The Schottky diode 510 corresponds essentially to the Schottky diode 410 of FIG. 4, although here the more heavily doped layer 542 is configured as a continuous n-doped layer with essentially constant increased n-type doping between the p-doped regions 52.

FIG. 6 shows yet another example of a Schottky diode 610. The Schottky diode 610 of FIG. 6 corresponds essentially to the Schottky diode 310 of FIG. 3, but it additionally comprises buried p-type regions 653. In the example represented, the buried p-type regions 653 are respectively arranged under the p-doped regions 52, and aligned therewith. The buried p-type regions 653 are arranged more deeply in the semiconductor body, and have no contact with the electrode 30 and the contact surface 634.

The buried p-type regions 653 protect the Schottky contact on the contact surface 634 against high field strengths. The buried p-type regions 653 are relatively weakly doped, and are swamped with charge carriers during forward bias of the Schottky diode, and therefore have no or only little effect on the forward voltage of the Schottky diode 610. In the breakdown direction, the buried p-type regions 653 are likewise biased in the breakdown direction, so that a space charge zone, which shields the Schottky contact against high field strengths, is formed in the lateral direction between the buried p-type regions 653.

In the lateral direction, the buried p-type regions 653 may extend further than the p-doped regions 52, as represented in FIG. 6. By virtue of this, the formation of the space charge zones in the event of breakdown, and therefore the shielding of the Schottky contact, can be improved.

While FIG. 6 shows the arrangement of the buried p-type regions 653 in the Schottky diode 310 of FIG. 3, the buried p-type regions may also be combined with the examples of FIGS. 4 and 5.

The invention claimed is:
1. A semiconductor component, comprising:
 a semiconductor body of a first conduction type that comprises a drift zone; and
 a metal layer on the semiconductor body, wherein the metal layer forms with the semiconductor body a Schottky contact along a contact surface,
 wherein a doping concentration of the first conduction type on the contact surface varies along a direction of the contact surface in such a way as to define a multiplicity of more heavily doped regions spaced apart from one another along the contact surface by a plurality of more weakly doped regions, wherein the multiplicity of more heavily doped regions have heavier doping than the drift zone of the semiconductor component and the plurality of more weakly doped regions, wherein both the more weakly doped regions and the more heavily doped regions have an excess of free charge carriers of the first conduction type.

2. The semiconductor component as claimed in claim 1, wherein the doping concentration of the first conduction type on the contact surface varies stepwise along a direction of the contact surface.

3. The semiconductor component as claimed in claim 1, wherein the doping concentration of the first conduction type on the contact surface varies continuously along a direction of the contact surface.

4. The semiconductor component as claimed in claim 2, wherein between at least two of the more heavily doped regions the contact surface has a doping concentration which corresponds to a doping concentration of the drift zone of the semiconductor body.

5. The semiconductor component as claimed in claim 1, wherein the at least one more heavily doped region has a depth of approximately 1 μm or less in a direction perpendicular to the contact surface.

6. The semiconductor component as claimed in claim 1, wherein the semiconductor body comprises silicon carbide (SiC), and wherein the at least one more heavily doped region has a depth of approximately 100 nm or less in a direction perpendicular to the contact surface.

7. The semiconductor component as claimed in claim 1, furthermore comprising at least one region of a second conduction type on the contact surface.

8. The semiconductor component as claimed in claim 7, wherein the region of the second conduction type has a greater depth in a direction perpendicular to the contact surface than the at least one more heavily doped region has.

9. The semiconductor component as claimed in claim 7, wherein the at least one more heavily doped region is arranged in an intermediate space between two regions of the second conduction type, and the lateral extent of the at least one more heavily doped region comprises less than ⅓ of the intermediate space.

10. The semiconductor component as claimed in claim 1, furthermore comprising at least one buried region of a second conduction type, which is buried in the semiconductor body.

11. The semiconductor component as claimed in claim 1, wherein the metal layer for forming the Schottky contact comprises at least one of Au, Pt, Cu, Ni, Ti, TiW, Mo, $Ti_xN_y$, $Mo_xN_y$, Pd, Mn, Al, Ag.

12. A semiconductor component, comprising:
a semiconductor body of a first conduction type;
a metal layer on the semiconductor body, wherein the metal layer forms with the semiconductor body a Schottky contact along a contact surface;
at least one region of a second conduction type on the contact surface, and
a plurality of regions with increased doping concentration of the first conduction type spaced apart from one another along the contact surface by a plurality of regions with decreased doping concentration, in which the doping concentration of the plurality of regions with increased doping concentration is greater than a doping concentration of the semiconductor body and a doping concentration of the regions with decreased doping concentration, wherein both the plurality of regions with increased doping concentration and the plurality of regions with decreased doping concentration have an excess of free charge carriers of the first conduction type.

13. The semiconductor component as claimed in claim 12, wherein the region of the second conduction type and the region on the contact surface, in which the doping concentration of the first conduction type is greater than a doping concentration of the semiconductor body, are arranged on the contact surface.

14. The semiconductor component as claimed in claim 13, wherein the doping concentration of the first conduction type on the contact surface varies stepwise along a direction of the contact surface to define the plurality of regions.

15. The semiconductor component as claimed in claim 13, wherein the doping concentration of the first conduction type on the contact surface varies continuously along a direction of the contact surface to define the plurality of regions.

16. The semiconductor component as claimed in claim 13, wherein the metal layer for forming the Schottky contact comprises at least one of Au, Pt, Cu, Ni, Ti, TiW, Mo, $Ti_xN_y$, $Mo_xN_y$, Pd, Mn, Al, Ag.

17. A semiconductor component, comprising:
a semiconductor body of a first conduction type that comprises a drift zone; and
a metal layer on the semiconductor body, wherein the metal layer forms with the semiconductor body a Schottky contact along a contact surface,
wherein a doping concentration of the first conduction type along the contact surface is greater than an underlying portion of the drift zone, and wherein the dopant concentration along the contact surface varies along a direction of the contact surface, and
wherein the doping concentration along the direction of the contact surface varies in such a way as to define a multiplicity of more heavily doped regions, which have heavier doping than neighboring regions at the contact surface and have heavier doping than the drift zone of the semiconductor component, wherein both the more heavily doped regions and the neighboring regions have an excess of free charge carriers of the first conduction type.

* * * * *